(12) United States Patent
Shinohara

(10) Patent No.: US 12,740,202 B2
(45) Date of Patent: Sep. 15, 2026

(54) METHOD OF MANUFACTURING LIGHT EMITTING DEVICE

(71) Applicant: NICHIA CORPORATION, Anan (JP)

(72) Inventor: Takaaki Shinohara, Anan (JP)

(73) Assignee: NICHIA CORPORATION, Anan (JP)

( * ) Notice: Subject to any disclaimer, the term of this patent is extended or adjusted under 35 U.S.C. 154(b) by 398 days.

(21) Appl. No.: 18/465,157

(22) Filed: Sep. 11, 2023

(65) Prior Publication Data

US 2024/0105888 A1 Mar. 28, 2024

(30) Foreign Application Priority Data

Sep. 28, 2022 (JP) ................................ 2022-155516

(51) Int. Cl.
*H10H 20/853* (2025.01)
*H10H 20/01* (2025.01)

(52) U.S. Cl.
CPC ....... *H10H 20/853* (2025.01); *H10H 20/0362* (2025.01)

(58) Field of Classification Search
CPC ............ H01L 2224/743; H01L 24/743; H10H 20/0362; H10H 20/853; H10H 20/0363; H10H 20/855
See application file for complete search history.

(56) References Cited

U.S. PATENT DOCUMENTS

2018/0212128 A1* 7/2018 Hayashi ............ H10H 20/8583
2020/0279981 A1* 9/2020 Maeda ................ H10H 20/857
2021/0036193 A1 2/2021 Imura et al.

FOREIGN PATENT DOCUMENTS

JP S59-145032 U 9/1984
JP H03-284371 A 12/1991
JP 2001-025699 A 1/2001
JP 2005-246258 A 9/2005
JP 2010086997 A * 4/2010 .......... H01L 24/743
JP 2018-207001 A 12/2018
JP 2020170818 A * 10/2020
JP 2021-027312 A 2/2021

OTHER PUBLICATIONS

English Translation of Ukawa (JP 2020-170818) (Year: 2020).*
English translation of Nakazato (JP 2010-086997) (Year: 2010).*

* cited by examiner

*Primary Examiner* — Zandra V Smith
*Assistant Examiner* — Douglas Yap
(74) *Attorney, Agent, or Firm* — Spencer Fane LLP

(57) ABSTRACT

A method of manufacturing a light emitting device includes: providing a light emitting element having an upper surface and a plurality of side surfaces connected to the upper surface; applying an adhesive resin onto the upper surface and the plurality of side surfaces of the light emitting element such that a lower end of the adhesive resin at a corner where adjacent ones of the side surfaces of the light emitting element meet is positioned lower than a lower end of the adhesive resin at a center of each of the side surfaces of the light emitting element; disposing a light transmissive member over the upper surface of the light emitting element with the adhesive resin being interposed between the light transmissive member and the upper surface of the light emitting element, and pressing the adhesive resin with the light transmissive member; and curing the adhesive resin.

13 Claims, 7 Drawing Sheets

50b
50a
50
20a
20c
400

11
12
13
20b
20
25
10A 400
50b
50a
50
40c 11
12
13
20b
20
25
10A

METHOD OF MANUFACTURING LIGHT EMITTING DEVICE

CROSS-REFERENCE TO RELATED APPLICATIONS

This application is based on and claims priority to Japanese Patent Application No. 2022-155516, filed on Sep. 28, 2022, the entire contents of which are incorporated herein by reference in their entireties.

BACKGROUND

The disclosure herein relates to a method of manufacturing a light emitting device.

Light emitting devices including a light emitting element such as a light emitting diode are known. As an example, Japanese Laid-open Patent Publication No. 2021-27312 describes a light emitting device including a light emitting element, a light transmissive member, and an adhesive resin. In the light emitting device, the light emitting element has a first surface serving as a light extraction surface, a second surface opposite to the first surface, a plurality of third surfaces between the first surface and the second surface, and a pair of electrodes on the second surface. The light transmissive member is disposed over the first surface. The adhesive resin is disposed between the light emitting element and the light transmissive member to cover from the first surface to the plurality of third surfaces of the light emitting element, and bonds the light emitting element and the light transmissive member.

In such a light emitting device, the adhesive resin functions as a light guide member that guides light emitted laterally from the light emitting element. More specifically, with this configuration, the light emitted laterally from the light emitting element is reflected by the side surfaces of the adhesive resin toward the light transmissive member.

SUMMARY

According to a method of manufacturing a light emitting device of the present disclosure, a light emitting device that can further improve light extraction efficiency can be provided.

A method of manufacturing a light emitting device according to an embodiment of the present disclosure includes: providing a light emitting element having an upper surface and a plurality of side surfaces connected to the upper surface; applying an adhesive resin onto the upper surface and the plurality of side surfaces of the light emitting element such that a lower end of the adhesive resin at a corner where adjacent ones of the side surfaces of the light emitting element meet is positioned lower than a lower end of the adhesive resin at a center of each of the side surfaces of the light emitting element; disposing a light transmissive member over the upper surface of the light emitting element with the adhesive resin being interposed between the light transmissive member and the upper surface of the light emitting element, and pressing the adhesive resin with the light transmissive member; and curing the adhesive resin.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1:
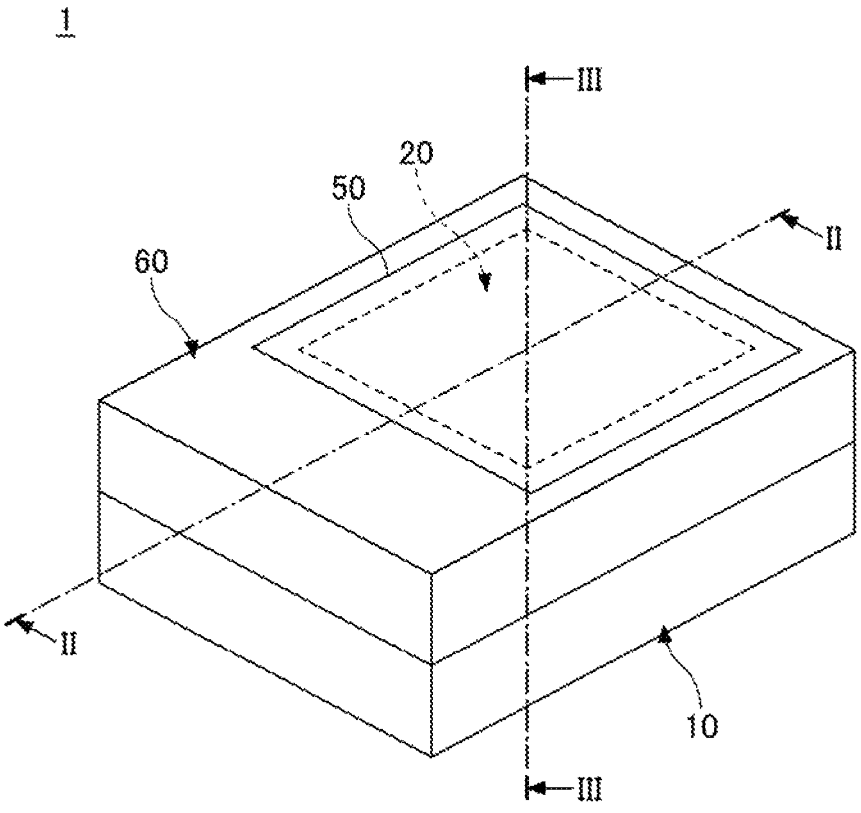
FIG. 1 is a perspective view schematically illustrating a light emitting device according to an embodiment.

In the following, a manufacturing method according to an embodiment of the present invention and a light emitting device obtained by the manufacturing method (hereinafter may be referred to as a "light emitting device according to an embodiment") will be described with reference to the accompanying drawings. In the following description, terms indicating specific directions and positions (for example, "upper", "lower", and other terms including these terms) are used as necessary. These terms are used to facilitate understanding of the present invention with reference to the drawings, and the technical scope of the present invention is not limited by the meaning of these terms. The same reference numerals appearing in a plurality of drawings refer to the same or equivalent portions or members.

Further, the following embodiments exemplify a light emitting device and the like to embody the technical idea of the present invention, and the present invention is not limited to the following description. In addition, unless otherwise specified, the dimensions, materials, shapes, relative arrangements, and the like of components described below are not intended to limit the scope of the present invention thereto, but are described as examples. The contents described in one embodiment can be applied to other embodiments and modifications. The sizes, positional relationships, and the like of members illustrated in the drawings may be exaggerated for clearer illustration. Furthermore, in order to avoid excessive complication of the drawings, a schematic view in which some elements are not illustrated may be used, or an end view illustrating only a cut surface may be used as a cross-sectional view.

<Light Emitting Device 1 According to Embodiment>

Figure 2:
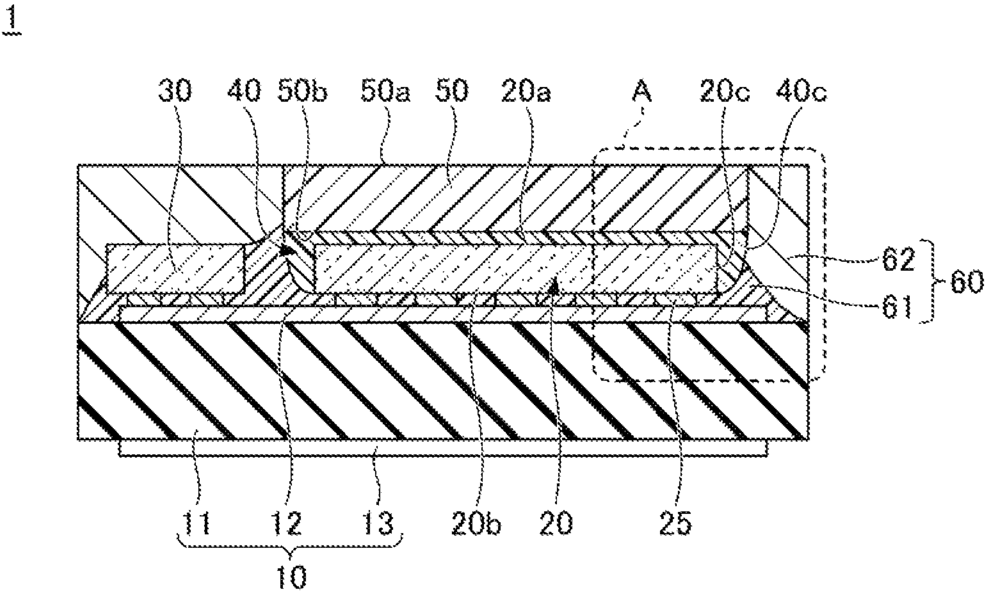
FIG. 2 is a vertical cross-sectional view of the light emitting device taken through II-II of FIG. 1.
Figure 3:
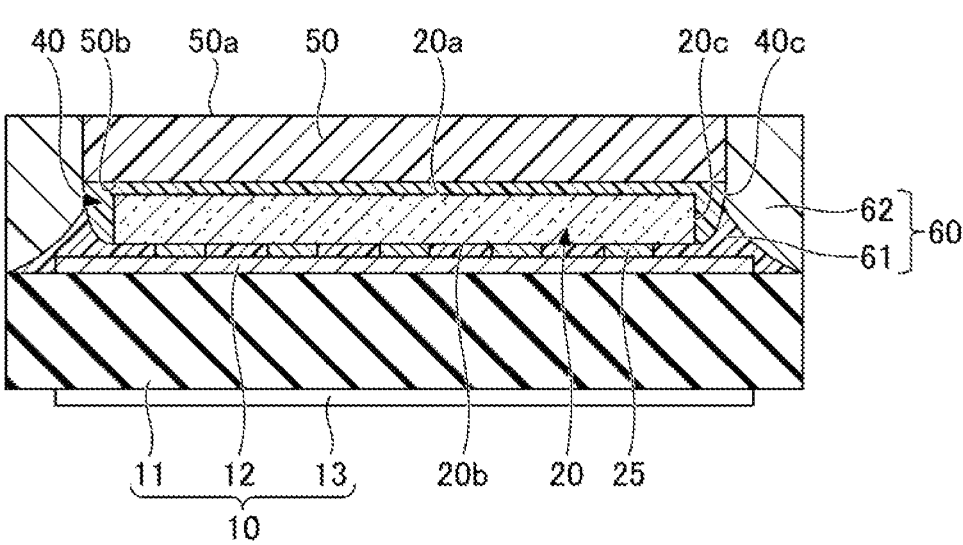
FIG. 3 is a vertical cross-sectional view of the light emitting device taken through III-III of FIG. 1.
Figure 4:
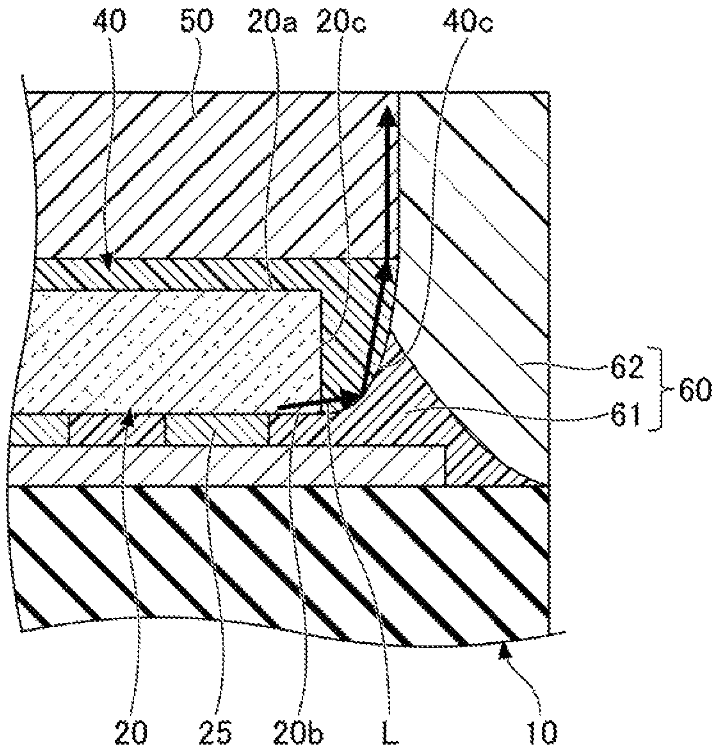
FIG. 4 is a partially enlarged view of a portion A of FIG. 2.

FIG. 1 is a perspective view schematically illustrating a light emitting device according to an embodiment. FIG. 2 is a vertical cross-sectional view of the light emitting device taken through II-II of FIG. 1. FIG. 3 is a vertical cross-sectional view of the light emitting device taken through III-III of FIG. 1. FIG. 4 is a partially enlarged view of a portion A of FIG. 2. As used herein, the term “vertical cross section” refers to a cross section of a light emitting device 1 taken along a plane perpendicular to the upper surface of a light emitting element 20.

As illustrated in FIG. 1 through FIG. 3, the light emitting device 1 includes a wiring substrate 10, the light emitting element 20, a protective element 30, a light guide member 40, a light transmissive member 50, and a covering member 60. Note that the light emitting device 1 may be configured to not include the protective element 30 and the covering member 60.

In the light emitting device 1, the light emitting element 20 is disposed on the wiring substrate 10. Further, in the light emitting device 1, the protective element 30 may be disposed on the wiring substrate 10. The light emitting element 20 has an upper surface 20*a*, a plurality of side surfaces 20*c* connected to the upper surface 20*a*, and a lower surface 20*b* opposite to the upper surface 20*a*. The plurality of side surfaces 20*c* are connected to the upper surface 20*a* and the lower surface 20*b*. In other words, each of the side surfaces 20*c* has outer edges connected to the outer edge of the upper surface 20*a* and to the outer edge of the lower surface 20*b*. Light is emitted from the upper surface 20*a*, the lower surface 20*b*, and the side surfaces 20*c* of the light emitting element 20.

The light emitting element 20 has the upper surface 20*a* having a substantially rectangular shape. For example, the exterior shape of the light emitting element 20 is a substantially cubic shape or a substantially rectangular parallelepiped shape. In this case, each of the upper surface 20*a* and the lower surface 20*b* of the light emitting element 20 has a substantially rectangular shape, and the light emitting element 20 has four side surfaces 20*c* each having a substantially rectangular shape. The upper surface 20*a* of the light emitting element 20 may have a polygonal shape such as a triangular shape or a hexagonal shape. Further, the exterior shape of the light emitting element 20 may be a columnar shape or a frustum shape having a polygonal-shaped upper surface.

The light guide member 40 continuously covers the upper surface 20*a* and the plurality of side surfaces 20*c* connected to the upper surface 20*a* of the light emitting element 20. Specifically, the light guide member covers the entire upper surface 20*a* and at least a portion on the upper end side (that is, the outer edge side connected to the upper surface 20*a*) of each of the side surfaces 20*c* of the light emitting element 20. The light guide member 40 has side surfaces 40*c* that contact the side surfaces 20*c* of the light emitting element 20 and contact the lower surface of the light transmissive member 50. The light guide member 40 preferably covers a larger region of the side surfaces 20*c* of the light emitting element 20, and more preferably covers approximately the entire side surfaces 20. That is, the side surfaces 40*c* of the light guide member 40 preferably contact the side surfaces 20*c* of the light emitting element 20 at positions close to the lower ends (on the side connected to the lower surface 20*b*) of the side surfaces 20*c*, and more preferably contact the lower ends of the side surfaces 20*c*. Specifically, a region in the range from 75% to 100% from the upper end of each of the side surfaces 20*c* in the height direction of the light emitting element 20 is preferably covered by the light guide member 40, and a region in the range from 90% to 100% from the upper end of each of the side surfaces 20*c* in the height direction of the light emitting element 20 is more preferably covered by the light guide member 40.

FIG. 3 illustrates a vertical cross section passing through two corners at each of which adjacent side surfaces 20*c* of the light emitting element 20 meet. As illustrated in FIG. 3, in a vertical cross-sectional view passing through two corners at each of which adjacent side surfaces 20*c* of the light emitting element 20 meet, each of the side surfaces 40*c* of the light guide member 40 preferably has a curved-line shape protruding away from a corresponding side surface 20*c* of the light emitting element 20. In addition, in a vertical cross-sectional view that does not pass through corners at each of which adjacent side surfaces 20*c* of the light emitting element 20 meet (for example, in a vertical cross-sectional view passing through the centers of two side surfaces 20*c*), each of the side surfaces 40*c* of the light guide member 40 preferably has a curved-line shape protruding away from a corresponding surface 20*c* of the light emitting element 20 as illustrated in FIG. 2. Note that a corner where adjacent side surfaces 20*c* of the light emitting element 20 meet refers to a corner where adjacent side surfaces 20*c* contact each other.

As described above, each of the side surfaces 40*c* of the light guide member 40 has a curved-line shape protruding away from a corresponding side surface 20*c* of the light emitting element 20. Thus, as illustrated in FIG. 4, light L emitted laterally from the lower ends of the side surfaces 20*c* of light emitting element 20 can be easily reflected by the interface between the covering member 60 and each of the side surfaces 40*c* of the light guide member 40, and is directed above the light emitting element 20. Accordingly, the amount of light incident on the light transmissive member 50 can be increased, thereby improving the light extraction efficiency of the light emitting device 1.

The light transmissive member 50 is disposed over the light emitting element 20 with the light guide member 40 interposed therebetween. The light transmissive member 50 has an upper surface 50*a*, a lower surface 50*b* opposite to the upper surface 50*a*, and side surfaces between the upper surface 50*a* and the lower surface 50*b*. The upper surface 50*a* of the light transmissive member 50 constitutes the upper surface of the light emitting device 1 and serves as the main light emitting surface of the light emitting device 1. The light guide member 40 is disposed on the upper surface 20*a* of the light emitting element 20, and the light transmissive member 50 is disposed over the light emitting element 20 with the light guide member 40 interposed therebetween such that the lower surface 50*b* of the light transmissive member 50 faces the upper surface 20*a* of the light emitting element 20. The light transmissive member 50 is disposed such that the lower surface 50*b* of the light transmissive member 50 is substantially parallel to the upper surface 20*a* of the light emitting element 20. The shape of the lower surface 50*b* of the light transmissive member 50 is preferably similar to the shape of the upper surface 20*a* of the light emitting element 20. For example, if the upper surface 20*a* of the light emitting element 20 has a rectangular shape, the lower surface 50*b* of the light transmissive member 50 preferably has a rectangular shape.

The lower surface 50*b* of the light transmissive member 50 is a flat surface. The upper surface 50*a* of the light transmissive member 50 may be a flat surface that is parallel to the lower surface 50*b*, or a portion of the upper surface 50*a* or the entire upper surface 50*a* is not necessarily parallel to the lower surface 50*b*. Each of the side surfaces of the light transmissive member 50 may be a surface perpendicular to the upper surface 50*a* and/or the lower surface 50*b*, an inclined surface, a curved surface, or the like. Note that a portion of or the entirety of the surfaces of the light transmissive member 50 may have projections and recesses.

The area of the lower surface 50*b* of the light transmissive member 50 is preferably larger than the area of the upper surface 20*a* of the light emitting element 20. Further, the light transmissive member 50 is preferably disposed to surround the outer periphery of the light emitting element 20 in a top view. Further, in the light emitting device 1, the light guide member 40, which is interposed between the lower surface 50*b* of the light transmissive member 50 and the upper surface 20*a* of the light emitting element 20, preferably covers a portion of the lower surface 50*b* of the light transmissive member 50 that does not overlap with the upper surface 20*a* of the light emitting element 20 in a top view. Further, in the light emitting device 1, the light guide member 40 preferably reaches the outer edge of the lower surface 50*b* of the light transmissive member 50, and the entire lower surface 50*b* is preferably covered by the light guide member 40. Accordingly, light emitted from the light emitting element 20 can, insofar as possible, incident on the lower surface 50*b* of the light transmissive member 50 through the light guide member 40.

The covering member 60 is provided on the wiring substrate 10, exposes the upper surface 50*a* of the light transmissive member 50, and covers the side surfaces 40*c* of the light guide member 40 and the side surfaces of the light transmissive member 50. If the light emitting device 1 includes the protective element 30, the covering member 60 preferably covers the upper surface, the lower surface, and the side surfaces of the protective element 30. Further, the covering member 60 may cover a portion of the side surfaces 20*c* of the light emitting element 20 exposed from the light guide member 40, and may cover the lower surface 20*b* of the light emitting element 20.

By causing the covering member 60 to cover the side surfaces 40*c* of the light guide member 40, light, emitted from the side surfaces 20*c* of the light emitting element 20 and transmitted through the light guide member 40, is reflected by the covering member 60. Further, by causing the covering member 60 to cover the lower surface 20*b* of the light emitting element 20, light traveling below the light emitting element 20 is reflected by the covering member 60. Accordingly, the light extraction efficiency of the light emitting device 1 can be improved.

The covering member 60 may be constituted by one member or may be constituted by a plurality of members. In the example illustrated in FIG. 2 and FIG. 3, the covering member 60 includes a first covering member 61 and a second covering member 62. For example, the first covering member 61 is provided on the wiring substrate 10, and covers at least a portion of the lower surface 20*b* of the light emitting element 20 and at least a portion of the side surfaces 40*c* of the light guide member 40. If the light emitting device 1 includes the protective element 30, the first covering member 61 covers the lower surface and at least a portion of the side surfaces of the protective element 30.

For example, the second covering member 62 is provided on the first covering member 61, and covers the side surfaces of the light transmissive member 50. If the light emitting device 1 includes the protective element 30, the second covering member 62 covers the upper surface of the protective element 30, for example. For example, the second covering member 62 may cover a portion of the side surfaces of the light transmissive member 50 and a portion of the side surfaces of the protective element 30.

The side surfaces of the second covering member 62 and the side surfaces of a base 11 of the wiring substrate 10 constitute the side surfaces of the light emitting device 1. The side surfaces of the second covering member 62 can be, for example, coplanar with the side surfaces of the base 11. Further, the upper surface of the second covering member 62 can be, for example, coplanar with the upper surface 50*a* of the light transmissive member 50.

Each component of the light emitting device 1 according to the embodiment will be described in detail below.

[Wiring Substrate 10]

The wiring substrate 10 is a member on which the light emitting element 20 is disposed. The wiring substrate 10 includes wiring for supplying power to the light emitting element from the outside, and includes the base 11 that supports the wiring. As an example, the wiring substrate 10 includes upper wiring 12 and lower wiring 13. The upper wiring 12 is disposed on the upper surface of the base 11 on which the light emitting element 20 is disposed, and the lower wiring 13 is disposed on the lower surface on the opposite side of the base 11 from the upper surface. The base 11 has, for example, a substantially cubic shape or a substantially rectangular parallelepiped shape. The base 11 is preferably formed of an insulating material through which light emitted from the light emitting element 20, external light, or the like is not easily transmitted. Examples of the material of the base 11 include ceramics such as aluminum oxide, aluminum nitride, silicon nitride, and mullite; resins such as epoxy resins, silicone resins, modified epoxy resins, urethane resins, phenol resins, polyimide resins, bismaleimide-triazine resins (BT resins), and polyphthalamide; semiconductors such as silicon; single metal materials such as copper and aluminum; and composite materials of these metal materials. Among them, a ceramic having excellent heat dissipation properties can be suitably used.

The upper wiring 12 includes wiring that is electrically connected to the light emitting element 20, and wiring that is electrically connected to the protective element 30. The lower wiring 13 includes an anode electrode and a cathode electrode that are electrically connected to an external power source. Examples of the material of each of the upper wiring 12 and the lower wiring 13 include metals such as iron, copper, nickel, aluminum, gold, silver, platinum, titanium, tungsten, and palladium, and an alloy including at least one of these metals. Further, the wiring substrate 10 may include relay wiring for connecting the upper wiring 12 and the lower wiring 13. The relay wiring may be provided inside the base 11 or on the side surface of the base 11.

The wiring substrate 10 does not necessarily include the lower wiring 13. In this case, the anode electrode and the cathode electrode that are electrically connected to the external power source may be provided on the upper surface or the side surface of the wiring substrate 10. The light emitting device 1 may have a configuration in which the wiring substrate 10 has a recess in the upper surface thereof, and the light emitting element 20 is disposed on the bottom of the recess. The light emitting device 1 may have a configuration in which the wiring substrate 10 is not included. For example, the light emitting device 1 may have a configuration in which a metal member, exposed from the covering member 60 covering the lower surface 20*b* of the light emitting element 20, is included as an electrode of the light emitting device 1.

(Light Emitting Element 20)

A semiconductor light emitting element such as a light emitting diode (LED) chip or a semiconductor laser diode (LD) chip can be suitably used as the light emitting element 20. The light emitting element 20 can have any shape, any size, and the like. The light emitting element 20 includes a plurality of electrodes 25 on the lower surface 20*b*, for example. The light emitting element 20 is disposed on the wiring substrate 10. The light emitting element 20 is flip-chip mounted on the wiring substrate 10 such that the lower surface 20*b*, on which the electrodes 25 are provided, faces the wiring substrate 10, for example. The plurality of electrodes 25 of the light emitting element 20 are electrically connected to the upper wiring 12. The plurality of electrodes 25 of the light emitting element 20 can be connected to the upper wiring 12 by using a known member such as eutectic solder, conductive paste, or bumps.

The light emitting element 20 includes, for example, a semiconductor structure and a support substrate that supports the semiconductor structure. The semiconductor structure includes an n-side semiconductor layer, a p-side semiconductor layer, and an active layer interposed between the n-side semiconductor layer and the p-side semiconductor layer. The active layer may be a single quantum well (SQW) structure or a multiple quantum well (MQW) structure including a plurality of well layers. The semiconductor structure includes a plurality of semiconductor layers made of nitride semiconductors. The nitride semiconductors include semiconductors of all compositions obtained by varying the composition ratio x and y within their ranges in the chemical formula $In_xAl_yGa_{1-x-y}N$ ($0 \le x$, $0 \le y$, $x+y \le 1$). The peak wavelength of light from the active layer can be appropriately selected in accordance with the purpose. The active layer is configured to emit, for example, visible light or ultraviolet light.

The light emitting element 20 may include one semiconductor structure on one support substrate, or may include a plurality of semiconductor stacks on one support substrate. One semiconductor structure may include one light emitting layer, or may include a plurality of light emitting layers. A semiconductor structure having a plurality of light emitting layers may be a structure that includes a plurality of active layers between one n-side semiconductor layer and one p-side semiconductor layer, or may be a structure that repeatedly stacks a structure that successively includes an n-type semiconductor layer, an active layer, and a p-type semiconductor layer.

In the light emitting element 20, the plurality of electrodes 25 are disposed on a semiconductor structure. The electrodes 25 include an n-electrode connected to an n-side semiconductor layer and a p-electrode connected to a p-side semiconductor layer. The p-electrode and the n-electrode may be disposed on different surfaces or the same surface of a semiconductor stack. In this example, the plurality of electrodes 25 including the p-electrode and the n-electrode are disposed on the same surface of the semiconductor structure. The surface of the semiconductor structure on which the plurality of electrodes 25 are disposed constitutes the lower surface 20*b* of the light emitting element 20, and the surface of the support substrate on the side opposite to the semiconductor structure constitutes the upper surface 20*a* of the light emitting element 20. As the support substrate, an insulating substrate, such as sapphire or a spinel ($MgAl_2O_4$), or a nitride-based semiconductor substrate such as gallium nitride can be used. The support substrate can be preferably formed of a light-transmissive material in order to extract light emitted from the active layer through the support substrate.

(Protective Element 30)

The light emitting device 1 can include, in addition to the light emitting element 20, electronic components such as the protective element 30. The protective element 30 is, for example, a Zener diode. Note that the light emitting device 1 does not necessarily include the protective element 30.

(Light Guide Member 40)

The light guide member 40 is a member that is disposed between the light emitting element 20 and the light transmissive member 50 and that bonds the light emitting element 20 and the light transmissive member 50. In addition, the light guide member 40 is a member that guides light, emitted from the light emitting element 20, to the light transmissive member 50. The light guide member 40 covers the side surfaces of the light emitting element 20, thereby allowing light emitted from the side surfaces of the light emitting element 20 to be easily guided to the light transmissive member 50. Accordingly, the light extraction efficiency of the light emitting device 1 can be improved.

The light guide member 40 is disposed to cover the upper surface 20*a* and each of the side surfaces 20*c* of the light emitting element 20. The light guide member 40 covering the side surfaces 20*c* of the light emitting element 20 can be formed by causing an uncured adhesive resin, which is to bond the light transmissive member 50 and the light emitting element 20, to wet and spread over the side surfaces 20*c* of the light emitting element 20 and to be subsequently cured. Examples of the adhesive resin, which serves as the light guide member 40 after being cured, include a light-transmissive resin. Examples of the light-transmissive resin include thermosetting resins such as epoxy resins, modified epoxy resins, silicone resins, and modified silicone resins. Among them, a silicone resin having high heat resistance can be suitably used. The light guide member 40 may include a light diffusion member and a phosphor, which will be described later.

(Light Transmissive Member 50)

The light transmissive member 50 is a member that is disposed over the light emitting element 20 and through which light emitted from the light emitting element 20 is transmitted and is emitted to the outside. The light transmissive member 50 transmits 60% or more and preferably 70% or more of light emitted from the light emitting element 20 and/or light having a wavelength converted from light emitted from the light emitting element 20 (for example, light having a wavelength in the range of 320 nm to 850 nm). The light transmissive member 50 may be formed of any of an inorganic material such as glass, ceramic, or sapphire; a resin including one or more of a silicone resin, a modified silicone resin, an epoxy resin, a modified epoxy resin, an acrylic resin, a phenol resin, and a fluorocarbon resin; and an organic material such as a hybrid resin. The light transmissive member 50 may include a phosphor that can convert the wavelength of at least a portion of incident light. If the light transmissive member 50 includes a phosphor, the light transmissive member 50 may be formed of, for example, a sintered body of a phosphor, any of the above-described materials containing phosphor powder, or the like. The light transmissive member 50 may be a light transmissive member in which a light transmissive layer, such as a resin layer containing a phosphor or a glass layer containing a phosphor, is formed on the surface of a molded body such as resin, glass, or ceramic. The light transmissive member 50 may include a filler such as a diffusing material according to the purpose. If the light transmissive member 50 includes a filler such as a diffusing material, the light transmissive member 50 may be formed of resin, glass, ceramic, or any other an inorganic material containing a filler. Alternatively, the light transmissive member 50 may be a light transmissive member in which a light transmissive layer, such as a resin layer containing a filler or a glass layer containing a filler, is formed on the surface of a molded body such as resin, glass, or ceramic.

Examples of the phosphor include yttrium aluminum garnet based phosphors (for example, $(Y,Gd)_3(Al,Ga)_5O_{12}$:Ce), lutetium aluminum garnet based phosphors (for example, $Lu_3(Al,Ga)_5O_{12}$:Ce), terbium aluminum garnet based phosphors (for example, $Tb_3(Al,Ga)_5O_{12}$:Ce), CCA based phosphors (for example, $Ca_{10}(PO_4)_6Cl_2$:Eu), SAE based phosphors (for example, $Sr_4Al_{14}O_{25}$:Eu), chlorosilicate based phosphors (for example, $Ca_8MgSi_4O_{16}Cl_2$:Eu), silicate based phosphors (for example, $(Ba,Sr,Ca,Mg)_2SiO_4$:Eu), oxynitride based phosphors such as β-SiAlON based phosphors (for example, $(Si,Al)_3(O,N)_4$:Eu) and α-SiAlON based phosphors (for example, $Ca(Si,Al)_{12}(O,N)_{16}$:Eu), nitride based phosphors such as LSN based phosphors (for example, $(La,Y)_3Si_6Ni_{11}$:Ce), BSESN based phosphors (for example, $(Ba,Sr)_2Si_5N_8$:Eu), SLA based phosphors (for example, $SrLiAl_3N_4$:Eu), CASN based phosphors (for example, $CaAlSiN_3$:Eu), and SCASN based phosphors (for example, $(Sr,Ca)AlSiN_3$:Eu), fluoride based phosphors such as KSF based phosphors (for example, $K_2SiF_6$:Mn), KSAF based phosphors (for example, $K_2(Si_{1-x}Al_x)F_{6-x}$:Mn, where x satisfies $0<x<1$), and MGF based phosphors (for example, $3.5MgO \cdot 0.5MgF_2 \cdot GeO_2$:Mn), quantum dots having a Perovskite structure (for example, $(Cs,FA,MA)(Pb,Sn)(F,Cl,Br,I)_3$, where FA and MA represent formamidinium and methylammonium, respectively), II-VI quantum dots (for example, CdSe), III-V quantum dots (for example, InP), and quantum dots having a chalcopyrite structure (for example, $(Ag,Cu)(In,Ga)(S,Se)_2$).

As the light diffusion member, any light diffusion member known in the art can be used. For example, titanium oxide, silicon oxide, aluminum oxide, barium titanate, or the like can be used.

Further, if a resin is used as a binder of a phosphor layer or a diffusing material layer, examples of the resin include thermosetting resins such as epoxy resins, modified epoxy resins, silicone resins, and modified silicone resins.

(Covering Member 60)

The covering member 60 preferably has light shielding properties. Specifically, the covering member 60 preferably has light reflectivity and/or light absorbability. The covering member 60 preferably includes a material that can appropriately reflect light emitted from the light emitting element 20. For example, the covering member 60 preferably has a reflectivity of 60% or more with respect to light emitted from the light emitting element 20. The covering member 60 more preferably has a reflectivity of 70% or more, 80% or more, or 90% or more with respect to light emitted from the light emitting element 20.

For the covering member 60, an insulating material is preferably used. The covering member 60 is a member formed of a light-transmissive resin containing particles of a light reflective substance. Examples of the resin used for the covering member 60 include a resin including one or more of a silicone resin, a modified silicone resin, an epoxy resin, a modified epoxy resin, a urea resin, an acrylic resin, a phenol resin, a bismaleimide-triazine resin, and a polyphthalamide resin, and a hybrid resin of two or more of these resins. Among them, a silicone resin having excellent light resistance, heat resistance, electrical insulation, and flexibility is preferably used. Examples of the light reflective substance include titanium oxide, silicon oxide, aluminum oxide, zirconium oxide, magnesium oxide, potassium titanate, barium titanate, zinc oxide, silicon nitride, aluminum nitride, boron nitride, calcium carbonate, calcium hydroxide, calcium silicate, and a combination thereof. Among them, titanium oxide having a relatively high refractive index is preferably used in terms of light reflection.

As described above, the covering member 60 may include the first covering member 61 and the second covering member 62. In this case, each of the first covering member 61 and the second covering member 62 can be formed of a material selected from the above materials exemplified as the material of the covering member 60. By causing the covering member 60 to include the first covering member 61 and the second covering member 62, for example, a material with high mechanical strength can be used for the second covering member 62 constituting the outer surface of the light emitting device 1, and a material with low elasticity and low linear expansion can be used for the first covering member 61 covering the lower surface 20*b* of the light emitting element 20, thereby relieving stress from resin expansion.

(Operation of Light Emitting Device 1)

In the light emitting device 1, in response to an electric current being supplied from the external power source to the light emitting element 20, the light emitting element 20 emits light. Of the light emitted from the light emitting element 20, light traveling upward (that is, toward the lower surface of the light transmissive member 50) is extracted to the outside of the light emitting device 1 through the light guide member 40 and the light transmissive member 50. Further, of the light emitted from the light emitting element 20, light traveling downward is reflected by the covering member 60 and the wiring substrate 10, and is extracted to the outside of the light emitting device 1 through the light guide member 40 and the light transmissive member 50. Further, of the light emitted from the light emitting element 20, light traveling in the lateral direction is reflected by the interface between the side surfaces 40*c* of the light guide member 40 and the covering member 60, and is extracted to the outside of the light emitting device 1 through the light guide member 40 and the light transmissive member 50. In this case, since each of the side surfaces 40*c* of the light guide member 40 has a curved-line shape protruding away from a corresponding side surface 20*c* of the light emitting element 20, the surface area of the interface, which serves as a reflective surface, between the light guide member 40 and the covering member 60 can be increased. Thus, the light can be more efficiently reflected. Accordingly, the light emitting device 1 having more excellent light extraction efficiency can be provided.

<Method of Manufacturing Light Emitting Device According to Embodiment>

A method of manufacturing a light emitting device according to an embodiment includes a step of providing a light emitting element having an upper surface and a plurality of side surfaces connected to the upper surface; a step of applying an adhesive resin onto the upper surface and the plurality of side surfaces of the light emitting element such that a lower end of the adhesive resin at a corner where adjacent side surfaces of the plurality of side surfaces of the light emitting element meet is positioned lower than a lower end of the adhesive resin at a center of each of the side surfaces of the light emitting element; a step of disposing a light transmissive member over the upper surface of the light emitting element and pressing the adhesive resin with the light transmissive member; and a step of curing the adhesive resin.

The method of manufacturing the light emitting device according to the embodiment may further include a step of disposing the light emitting element on a wiring substrate before the step of applying the adhesive resin.

The method of manufacturing the light emitting device according to the embodiment may further include a step of disposing a covering member to cover side surfaces of the adhesive resin and side surfaces of the light transmissive member after the step of curing the adhesive resin.

In the following, the manufacturing steps of the method of manufacturing the light emitting device according to the embodiment will be described with reference to the drawings.

Figure 6:
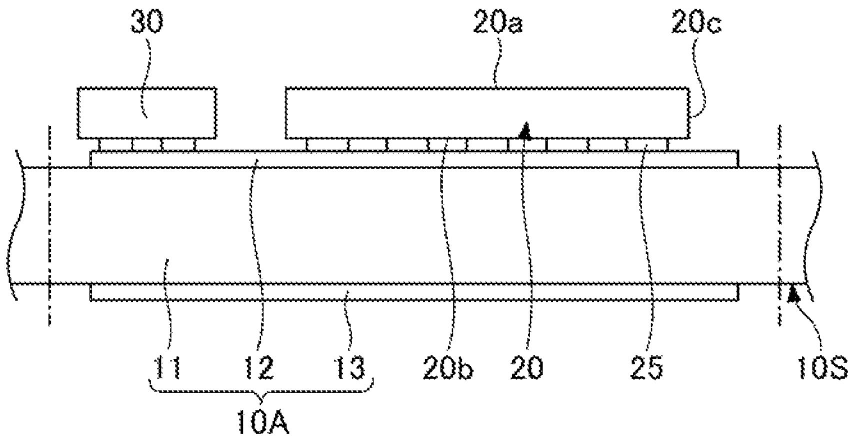
FIG. 6 is a side view schematically illustrating a manufacturing step of the method of manufacturing the light emitting device according to the embodiment.
Figure 7:
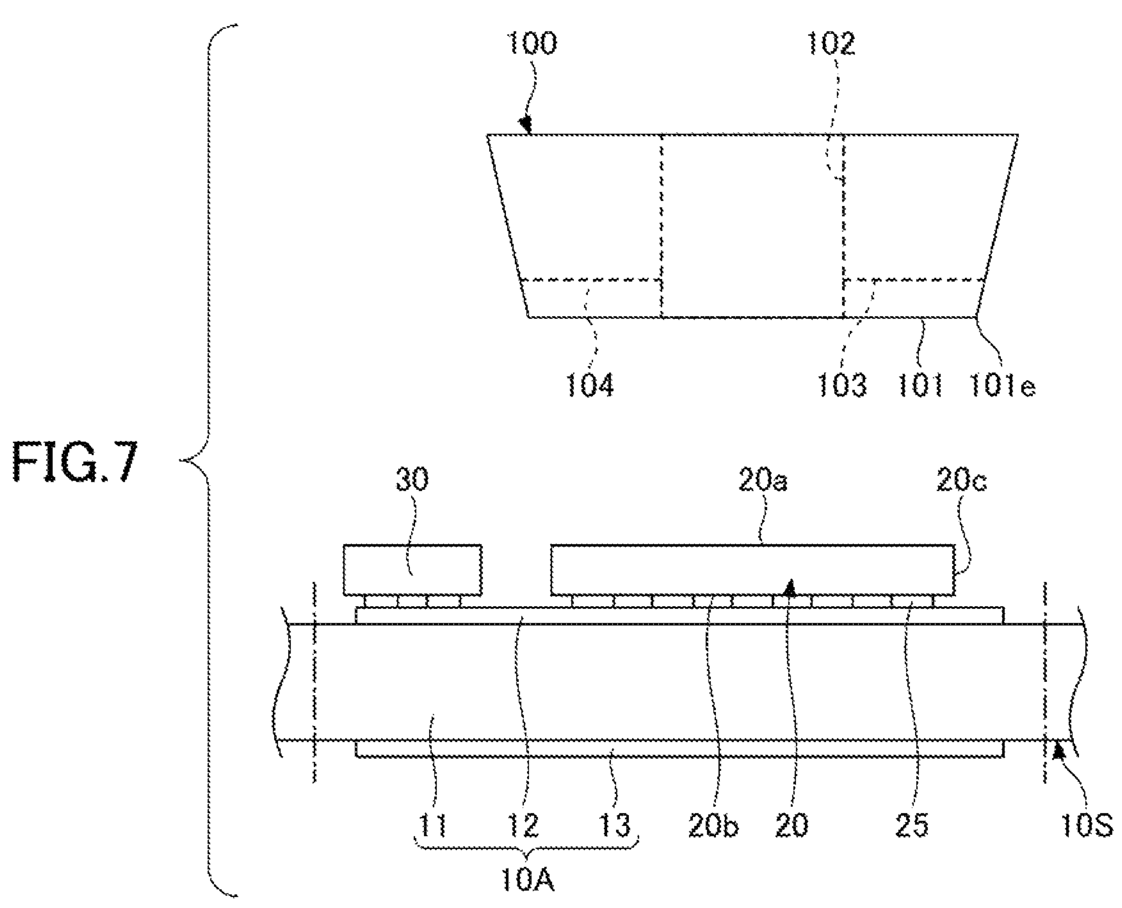
FIG. 7 is a side view schematically illustrating a manufacturing step of the method of manufacturing the light emitting device according to the embodiment.
Figure 8:
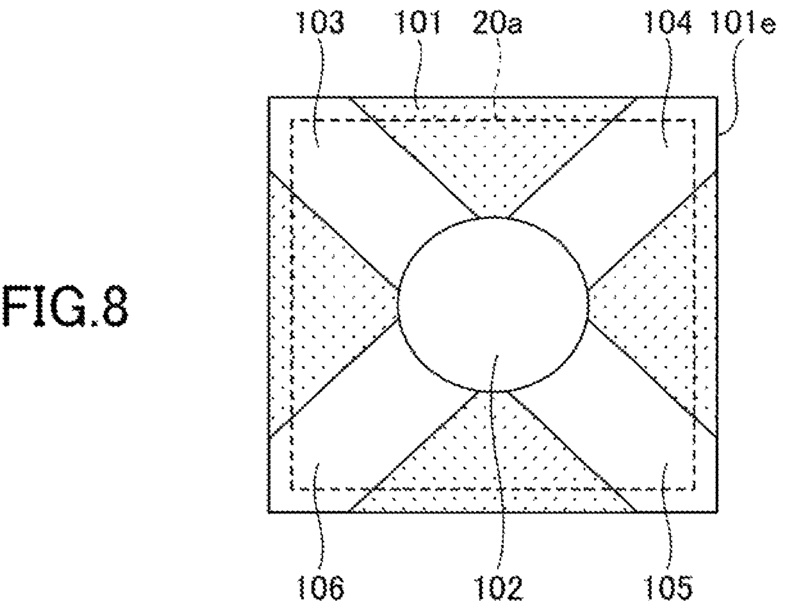
FIG. 8 is a bottom view schematically illustrating the manufacturing step of the method of manufacturing the light emitting device according to the embodiment.
Figure 9:
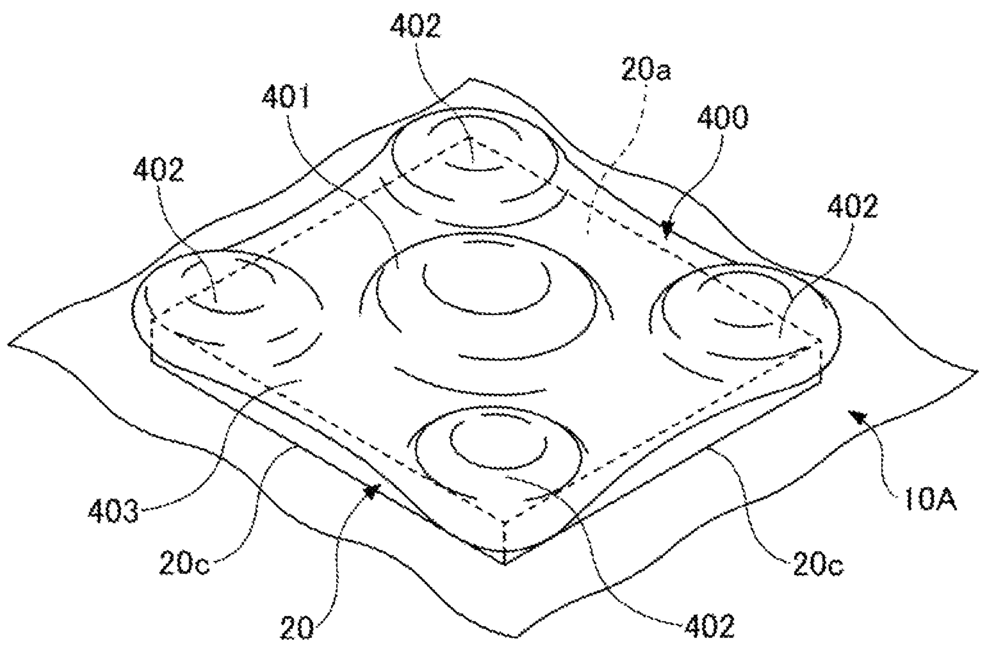
FIG. 9 is a perspective view schematically illustrating the manufacturing step of the method of manufacturing the light emitting device according to the embodiment.
Figure 10:
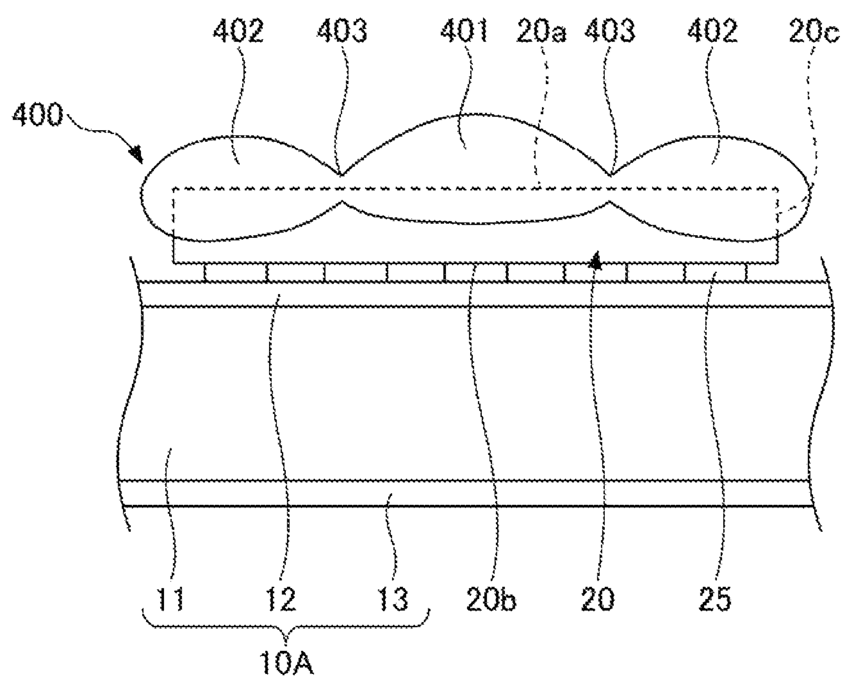
FIG. 10 is a side view schematically illustrating the manufacturing step of the method of manufacturing the light emitting device according to the embodiment.
Figure 11A:
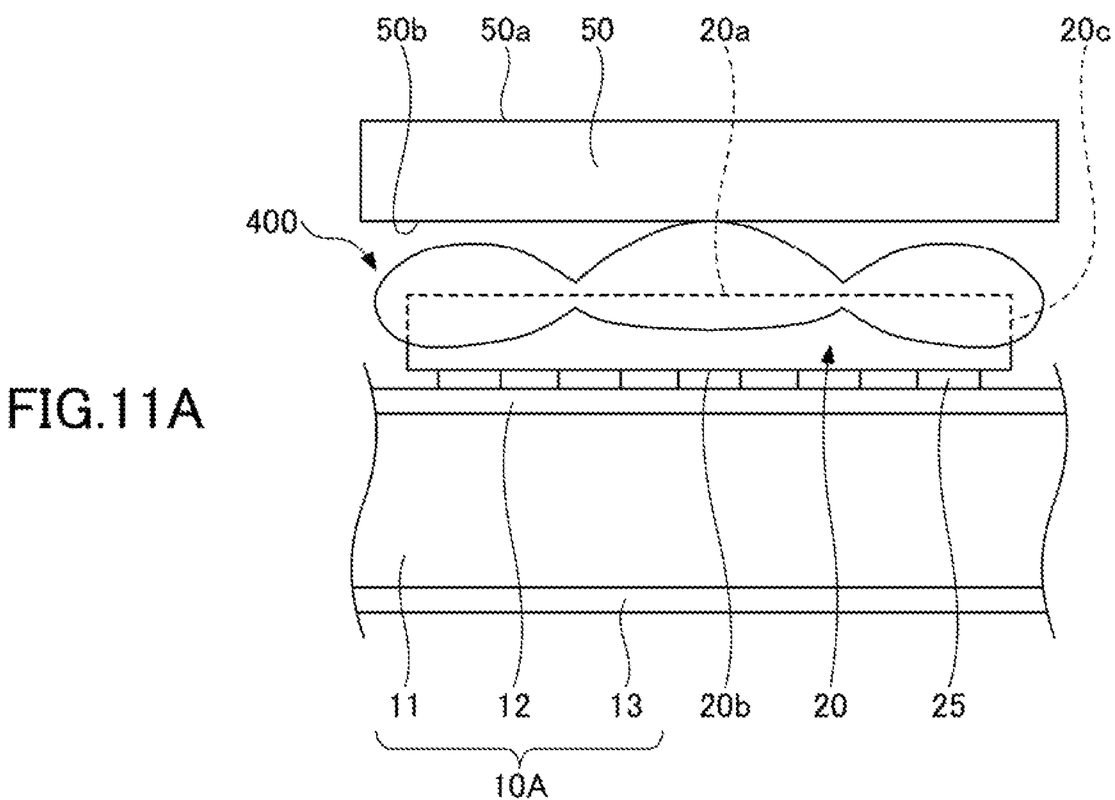
FIG. 11A is a side view schematically illustrating a manufacturing step of the method of manufacturing the light emitting device according to the embodiment.
Figure 11B:
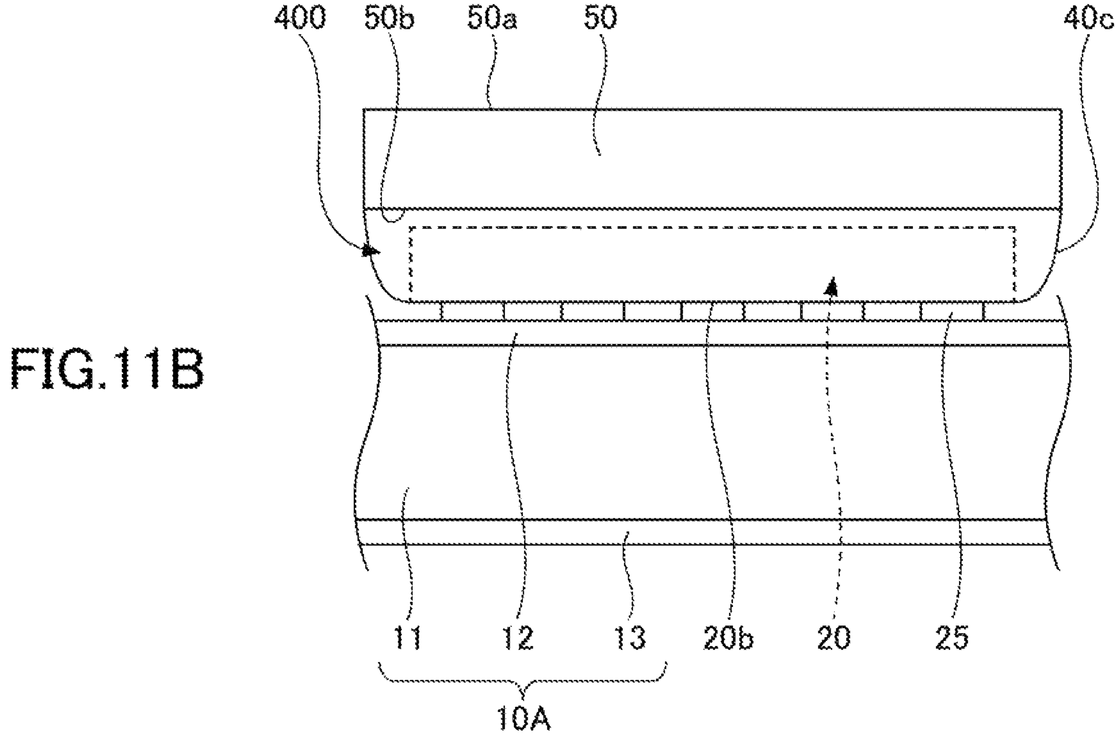
FIG. 11B is a side view schematically illustrating the manufacturing step of the method of manufacturing the light emitting device according to the embodiment.
Figure 12:
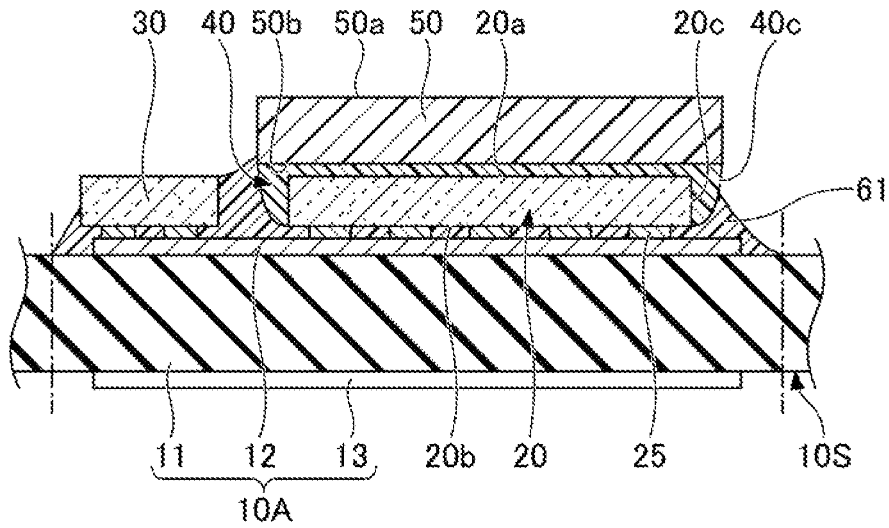
FIG. 12 is a cross-sectional view schematically illustrating a manufacturing step of the method of manufacturing the light emitting device according to the embodiment.
Figure 13:
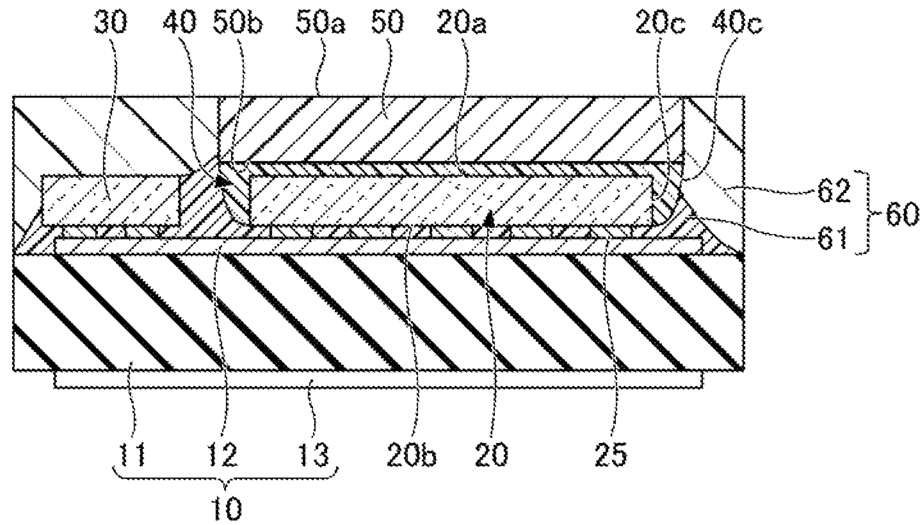
FIG. 13 is a cross-sectional view schematically illustrating the manufacturing step of the method of manufacturing the light emitting device according to the embodiment.

FIG. 5 through FIG. 13 are schematic diagrams illustrating the manufacturing steps of the light emitting device according to the embodiment. Specifically, FIG. 5 to FIG. 7, FIG. 10, FIG. 11A, and FIG. 11B are side views illustrating manufacturing steps of the light emitting device. FIG. 8 is a bottom view of a nozzle used to supply a resin in a manufacturing step of the light emitting device, as viewed from the end surface of the nozzle. FIG. 9 is a perspective view illustrating the manufacturing step of the light emitting device. FIG. 12 and FIG. 13 are cross-sectional views illustrating a manufacturing step of the light emitting device.

(Step of Providing Light Emitting Element)

Figure 5:
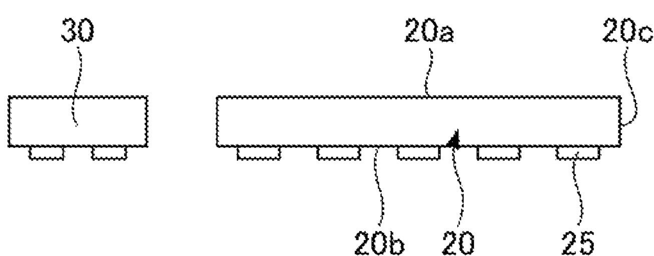
FIG. 5 is a side view schematically illustrating a manufacturing step of a method of manufacturing a light emitting device according to an embodiment.

First, as illustrated in FIG. 5, a light emitting element 20 including an upper surface 20*a*, a lower surface 20*b*, and a plurality of side surfaces 20*c* connected to the upper surface 20*a* and the lower surface 20*b* is prepared. In addition, a protective element 30 is prepared. The protective element 30 is prepared as necessary. In the following, an example in which the upper surface 20*a* of the light emitting element 20 has a square shape will be described.

(Step of Disposing Light Emitting Element on Wiring Substrate)

Next, as illustrated in FIG. 6, a substrate 10S including a plurality of regions 10A is prepared. Note that the plurality of regions 10A are to be separated, each of which serves as a wiring substrate 10 of a light emitting device 1. The plurality of regions 10A are two-dimensionally arranged in a matrix in a top view of the substrate 10S. The light emitting element 20 and the protective element 30 are disposed on each of the regions 10A of the substrate 10S. For example, the light emitting element 20 and the protective element 30 are flip-chip mounted on each of the regions 10A of the substrate 10S such that electrodes of the light emitting element 20 face upper wiring 12.

(Step of Applying Adhesive Resin)

Next, as illustrated in FIG. 7 through FIG. 10, an uncured adhesive resin 400, which serves as a light guide member 40 after cured, is applied onto the upper surface 20*a* and the side surfaces 20*c* of the light emitting element 20. The adhesive resin 400 is disposed such that the lower ends of the adhesive resin 400 at the corners where the side surfaces 20*c* of the light emitting element 20 meet are positioned lower than the lower ends of the adhesive resin 400 at the centers of the side surfaces 20*c* of the light emitting element 20 as shown in FIGS. 9 and 10. As used herein, the "center of a side surface 20*c*" of the light emitting element 20 refers to a portion that is located on a straight line equidistant from both sides of the side surface 20*c* (that is, equidistant from the boundaries between the side surface 20*c* and adjacent side surfaces) as viewed in the normal direction of the side surface 20*c*.

Specifically, as illustrated in FIG. 7 and FIG. 8, first, a nozzle 100 having a discharge hole 102 in an end surface 101 thereof is prepared. Then, the nozzle 100 is disposed above the light emitting element 20 such that the end surface 101 faces the upper surface 20*a* of the light emitting element 20.

The size of the end surface 101 of the nozzle 100 is preferably larger than the size of the upper surface 20*a* of the light emitting element 20. For example, if the upper surface 20*a* of the light emitting element 20 is a square of L mm×L mm, the end surface 101 is preferably a square of 1.05 L mm×1.05 L mm or more and 1.15 L mm×1.15 L mm or less. As illustrated in FIG. 7, the nozzle 100 is disposed above the light emitting element 20, such that the end surface 101 faces the upper surface 20*a* of the light emitting element 20 and an outer edge 101*e* of the end surface 101 is located outward relative to the outer edge of the upper surface 20*a* of the light emitting element 20.

Further, as illustrated in FIG. 8, the nozzle 100 preferably has the discharge hole 102 and a plurality of grooves 103, 104, 105, and 106. The discharge hole 102 has an opening in the center of the end surface 101, and the plurality of grooves have respective openings in the end surface 101, are in communication with the discharge hole 102, and extend from the discharge hole 102 to the outer edge 101*e* of the end surface 101. In the example illustrated in FIG. 8, the discharge hole 102 has a circular shape in a bottom view. Further, in the example illustrated in FIG. 8, four grooves 103, 104, 105, and 106 are arranged in an X shape and extend from the discharge hole 102 to the outer edge 101*e* in the diagonal direction of the end surface 101 in a bottom view. If the upper surface 20*a* of the light emitting element 20 has a polygonal shape other than a rectangular shape, the end surface of the nozzle 100 preferably has a similar polygonal shape, and a plurality of grooves preferably extend from the center to the vertices of the polygonal shape.

In FIG. 8, regions of the end surface 101, where the discharge hole 102 and the grooves 103 through 106 are not provided, are indicated by a dot pattern. The regions indicated by a dot pattern are substantially flat. In FIG. 8, in order to indicate the positional relationship between the outer edge 101*e* of the end surface 101 and the outer edge of the upper surface 20*a* of the light emitting element 20, the outer edge of the upper surface 20*a* of the light emitting element 20 is indicated by a dashed line for convenience.

By using the nozzle 100 having the above-described configuration, positions to which the adhesive resin 400 is applied can be easily controlled. That is, the adhesive resin 400 can easily flow from the upper surface 20*a* of the light emitting element 20 to the corners where the side surfaces 20*c* meet. In addition, the adhesive resin 400 can be easily accumulated at the corners of the light emitting element 20 by surface tension.

The bottom surface of each of the grooves 103 through 106 is, for example, flat, and the side surfaces of the grooves 103 through 106 are perpendicular to the end surface 101. Each of the grooves 103 through 106 preferably has a substantially constant width and a substantially constant depth. Accordingly, when the adhesive resin 400 flows in the grooves, the flow state of the adhesive resin 400 can be stabilized, thereby suppressing the occurrence of voids in the adhesive resin 400.

Note that the outer edge 101*e* of the end surface 101 refers to the outer edge of the end surface 101 in a bottom view as illustrated in FIG. 8. That is, in a bottom view as illustrated in FIG. 8, four sides of a square including portions where grooves 103 through 106 are formed are the outer edge 101*e* of the end surface 101. Further, in a bottom view as illustrated in FIG. 8, the size of the outer edge 101*e* of the end surface 101 is the size of the end surface 101 as described above.

Next, the uncured adhesive resin 400 is discharged from the nozzle 100 onto the upper surface 20*a* of the light emitting element 20. When a predetermined amount of the adhesive resin 400 is discharged, the discharge of the adhesive resin 400 is stopped, and the nozzle 100 is moved from above the light emitting element 20. In this manner, as illustrated in FIG. 9 and FIG. 10, the adhesive resin 400 is discharged from the discharge hole 102, applied to the upper surface 20*a* of the light emitting element 20, and applied to the corners where the side surfaces 20*c* of the light emitting element 20 meet. The lower ends of the adhesive resin 400 at the corners where the side surfaces 20*c* of the light emitting element 20 meet are positioned lower than the lower ends of the adhesive resin 400 at the centers of the side surfaces 20*c* of the light emitting element 20.

More specifically, the adhesive resin 400 discharged from the discharge hole 102 is first applied to the center of the upper surface 20*a* of the light emitting element 20, and flows from the center of the upper surface 20*a* toward the corners of the upper surface 20*a* along the grooves 103 through 106. Since the outer edge 101*e* of the end surface 101 of the nozzle 100 is located outward relative to the outer edge of the upper surface 20*a* of the light emitting element 20, the adhesive resin 400 can flow beyond the outer edge of the upper surface 20*a* to the corners where the side surfaces 20*c* of the light emitting element 20 meet. The discharge hole and the grooves are not located above the centers of the side surfaces 20*c* of the light emitting element 20, and thus, the amount of the adhesive resin 400 applied is smaller at the centers of the side surfaces 20*c* than the corners where the side surfaces 20*c* meet.

As described, the corners where the side surfaces 20*c* of the light emitting element 20 meet are covered by the adhesive resin 400. Thus, when the adhesive resin 400 is pressed with the light transmissive member 50 in the subsequent step, the adhesive resin 400 can be applied to lower portions of the corners where the side surfaces 20*c* of the light emitting element 20 meet. Further, the amount of the adhesive resin covering the side surfaces 20*c* can be increased by adjusting the viscosity of the adhesive resin 400 such that the adhesive resin 400 is easily accumulated at the side surfaces 20*c* by surface tension. Accordingly, the light guide member 40 covering the side surfaces 20*c* of the light emitting element 20 can be formed in a shape having curved surfaces protruding away from the side surfaces 20*c* of the light emitting element 20. As a result, light from the side surfaces 20*c* of the light emitting element 20 is easily incident on the light guide member 40 and is easily reflected upward. Accordingly, the light extraction efficiency of the light emitting device 1 can be improved. Note that the viscosity of the uncured adhesive resin 400 can be adjusted by the physical properties of a resin to be selected and the amount of a viscosity adjustment filler to be contained in the resin.

In the step of applying the adhesive resin 400, the adhesive resin 400 is preferably applied onto the light emitting element 20 such that a first portion 401 of the adhesive resin 400 at the center of the upper surface 20*a* of the light emitting element 20 is higher than a second portion 402 of the adhesive resin 400 located at each of the corners of the upper surface 20*a* of the light emitting element 20, as measured from the upper surface 20*a* of the light emitting element 20. Accordingly, in the step of pressing the adhesive resin 400 with the light transmissive member 50, the pressed adhesive resin 400 can easily spread from the center of the upper surface 20*a* of the light emitting element 20 toward the outer edge of the upper surface 20*a*. Therefore, voids are not readily formed in the adhesive resin 400. Even if voids are formed, the voids can be easily moved to the outer side of the upper surface 20*a* and can be discharged to the outside. Further, the adhesive resin 400 is easily applied to the outer edge of the lower surface of the light transmissive member 50.

In the step of applying the adhesive resin 400, the adhesive resin may be applied so as to include the first portion 401, the second portion 402, and a third portion 403 between the first portion 401 and the second portion 402. In this case, the first portion 401 is preferably higher than the second portion 402 as measured from the upper surface 20*a* of the light emitting element 20. In addition, the second portion 402 is preferably higher than the third portion 403 as measured from the upper surface 20*a* of the light emitting element 20. Further, the second portion 402 is preferably continuous with a portion of the adhesive resin 400 located at each of the corners where the side surfaces 20*c* of the light emitting element 20 meet. In other words, in a top view, the second portion 402 is preferably located so as to overlap with a portion of the adhesive resin 400 located at each of the corners where the side surfaces 20*c* of the light emitting element 20 meet. Accordingly, in the step of pressing the adhesive resin 400 with the light transmissive member 50, which will be described later, the adhesive resin 400 can be applied to lower portions of the corners where the side surfaces 20*c* of the light emitting element 20 meet.

The adhesive resin 400 including the first portion 401, the second portion 402, and the third portion 403, and having the above-described configuration will be described in detail.

First, the adhesive resin 400 supplied from the discharge hole 102 covers the center of the upper surface 20*a* of the light emitting element 20. Then, the adhesive resin 400 flows on the upper surface 20*a* along the grooves, reaches the corners of the upper surface 20*a*, and flows beyond the corners of the upper surface 20*a*. After the adhesive resin 400 reaches the corners of the upper surface 20*a*, the supply of the adhesive resin 400 is stopped, and the nozzle is moved upward. That is, when the adhesive resin 400 is applied onto the light emitting element 20, a start point of the supply of the adhesive resin 400 is the first portion 401 located at the center of the upper surface 20*a*, and an end point of the supply is also the first portion 401. In a resin discharging device, a large amount of a resin tends to be discharged at the start point and the end point of the supply. Therefore, the height of the first portion 401 of the adhesive resin 400 is the greatest as measured from the upper surface 20*a* of the light emitting element 20. Further, a start point of the flow of the adhesive resin 400 is the first portion 401, and an end point of the flow of the adhesive resin 400 is in the vicinity of the second portion 402. The adhesive resin 400 flows beyond the upper surface 20*a* of the light emitting element 20 to the corners where the side surfaces 20*c* of the light emitting element 20 meet. Then, the supply of the adhesive resin 400 is stopped. The height of the second portion 402 of the adhesive resin 400 from the upper surface 20*a* of the light emitting element 20 is maintained by surface tension. The third portion 403 of the adhesive resin 400 spreads due to wettability after the supply of the adhesive resin 400 is stopped. Therefore, the third portion 403 is lower than the first portion 401 and the second portion 402 as measured from the upper surface 20*a* of the light emitting element 20.

By using the above-described manufacturing method, the adhesive resin 400 can be applied to desired positions of the upper surface and the side surfaces of the light emitting element 20. If the adhesive resin 400 is applied only to the upper surface 20*a* of the light emitting element 20 and the adhesive resin 400 is caused to flow to the side surfaces 20*c* of the light emitting element 20 by being pressed, a small amount of the adhesive resin 400 would be applied to the corners where the side surfaces 20*c*, which are relatively distant from the center of the upper surface 20*a*, of the light emitting element 20 meet. Conversely, according to the present embodiment, the adhesive resin 400 is applied so as to include the first portion 401 and the second portion 402, and the second portion 402 is continuous with a portion of the adhesive resin 400 located at each of the corners where the side surfaces 20*c* of the light emitting element 20 meet. Therefore, the amount of the adhesive resin 400 covering the corners where the side surfaces 20*c* of the light emitting element 20 meet can be relatively increased. Further, by causing the first portion 401, the second portion 402, and the third portion 403 to have a height relationship as described above, when the adhesive resin 400 is pressed with the light transmissive member 50 in the subsequent step, the adhesive resin 400 can spread easily and evenly, and also the adhesive resin 400 can easily cover the side surfaces 20*c* of the light emitting element 20. By causing the adhesive resin 400 to cover the side surfaces 20*c* of the light emitting element 20, when the light emitting device 1 is completed in final form, light emitted from the side surfaces 20*c* of the light emitting element 20 is easily incident on the light guide member 40, obtained by curing the adhesive resin 400, and is easily reflected upward. Accordingly, the light extraction efficiency of the light emitting device 1 can be improved.

(Step of Pressing Adhesive Resin)

Next, as illustrated in FIG. 11A and FIG. 11B, the adhesive resin 400 is pressed with the light transmissive member 50. Specifically, as illustrated in FIG. 11A, first, the light transmissive member 50 is disposed over the upper surface 20*a* of the light emitting element 20. The light transmissive member 50 preferably has the lower surface 50*b* having an area larger than the area of the upper surface 20*a* of the light emitting element 20. Further, the light transmissive member 50 is preferably disposed to surround the light emitting element 20 in a top view.

Next, as illustrated in FIG. 11B, the adhesive resin 400 is pressed with the light transmissive member 50. Accordingly, the adhesive resin 400 with an approximately constant thickness is applied between the upper surface 20*a* of the light emitting element 20 and the lower surface 50*b* of the light transmissive member 50. Further, when the adhesive resin 400 is pressed, the adhesive resin 400 flows beyond the upper surface 20*a* of the light emitting element 20 and is applied to a portion of or the entirety of each of the side surfaces 20*c* of the light emitting element 20 while covering the lower surface of the light transmissive member 50. The adhesive resin 400 remains on or within the outer edge of the lower surface 50*b* of the light transmissive member 50 and remains on or above the lower ends of the side surfaces 20 of the light emitting element 20 by surface tension. In a state in which the adhesive resin 400 is formed in a shape having curved surfaces protruding outward, the adhesive resin 400 is stabilized. Accordingly, the thickness of the adhesive resin 400 covering the side surfaces 20*c* of the light emitting element 20 can be increased.

In the step of pressing the adhesive resin 400, the adhesive resin 400 is preferably pressed with the light transmissive member 50 such that the adhesive resin 400 reaches the outer edge of the lower surface 50*b* of the light transmissive member 50. In addition, the adhesive resin 400 is preferably pressed with the light transmissive member 50 such that the adhesive resin 400 reaches the lower ends of the side surfaces 20*c* of the light emitting element 20. That is, the adhesive resin 400 preferably covers the entire lower surface of the light transmissive member 50 and the entire side surfaces 20*c* of the light emitting element 20. Accordingly, when the light emitting device 1 is completed in final form, light from the side surfaces 20*c* of the light emitting element 20 can be, insofar as possible, guided to the light transmissive member 50 through the light guide member 40. Therefore, the light extraction efficiency of the light emitting device 1 can be improved. In the example illustrated in FIG. 11B, the adhesive resin 400 is applied so as to cover the entire lower surface of the transmissive member 50 and reach the lower ends of the side surfaces 20*c* of the light emitting element 20.

In the step of pressing the adhesive resin 400, the pressed adhesive resin 400 is preferably spaced apart from the surface of the wiring substrate 10 (that is, one of the regions 10A of the substrate 10S). By causing the adhesive resin 400 to be spaced apart from the wiring substrate 10, a situation in which the adhesive resin 400 is formed into an irregular shape and light emitted from the light emitting element 20 is reflected in an unintended direction can be avoided. Accordingly, the light extraction efficiency of the light emitting device 1 can be improved. After the step illustrated in FIG. 11A and FIG. 11B, the light guide member 40 is obtained by curing the adhesive resin 400.

(Step of Curing Adhesive Resin)

In the step of curing the adhesive resin 400, the adhesive resin 400 is cured (or hardened). The light guide member 40 is formed by curing the adhesive resin 400, and as a result, the light transmissive member 50 and the light emitting element 20 are bonded together via the light guide member 40. The adhesive resin 400 can be cured by a known method such as heating in an oven, for example.

The step of curing the adhesive resin 400 may be performed simultaneously with the step of pressing the adhesive resin 400 with the light transmissive member 50. Further, in a state in which the adhesive resin 400 is pressed to a desired position in the step of pressing the adhesive resin 400, the light transmissive member 50 may be held by a collet or the like and maintained such that the lower surface 50*b* of the light transmissive member 50 and the upper surface 20*a* of the light emitting element 20 are parallel to each other, and in this state, the step of curing the adhesive resin 400 may be completed.

(Step of Disposing Covering Member)

Next, as illustrated in FIG. 12 and FIG. 13, a covering member 60 is disposed to cover the side surfaces 40*c* of the cured adhesive resin 400 (that is, the light guide member 40) and the side surfaces of the light transmissive member 50. Specifically, as illustrated in FIG. 12, first, an uncured first covering member 61 is disposed on each of the regions 10A to cover the lower surface 20*b* of the light emitting element 20, at least a portion of the side surfaces 40*c* of the light guide member 40, the lower surface of the protective element 30, and at least a portion of the side surfaces of the protective element 30. The first covering member 61 can be disposed on each of the regions 10A by, for example, potting, spraying, printing, or the like. Thereafter, the uncured first covering member 61 is cured.

Next, as illustrated in FIG. 13, an uncured second covering member 62 is disposed on the cured first covering member 61 to cover the side surfaces of the light transmissive member 50. The second covering member 62 may cover the upper surface of the protective element 30, a portion of the side surfaces of the protective element 30, and a portion of the side surfaces of the light transmissive member 50. The second covering member 62 can be disposed on the first covering member 61 by, for example, potting, spraying, printing or the like. Then, the uncured second covering member 62 is cured, and as a result, the covering member 60 including the cured first covering member 61 and the cured second covering member 62 is formed. Thereafter, the regions 10A are separated by dicing or the like. Each of the separated regions 10A serves as the wiring substrate 10 of the light emitting device. In this manner, the light emitting device 1 can be obtained.

Instead of disposing the covering member 60 including the first covering member and the second covering member, the first covering member 61 alone may be disposed to cover the side surfaces 40*c* of the adhesive resin 400 (that is, the light guide member 40) and the side surfaces of the light transmissive member 50. That is, the covering member 60 may include the first covering member 61 only.

Further, the second covering member may be disposed with the first covering member being uncured, and the first covering member and the second covering member may be cured simultaneously.

According to an embodiment of the present disclosure, a method of manufacturing a light emitting device that can further improve light extraction efficiency can be provided.

Although embodiments and the like have been described in detail above, the present disclosure is not limited to the above-described embodiments and the like, and various modifications and substitutions can be made to the above-described embodiments and the like without departing from the scope recited in the claims.

What is claimed is:

1. A method of manufacturing a light emitting device comprising:

providing a light emitting element having an upper surface and a plurality of side surfaces each including an upper edge connected to the upper surface;

applying an adhesive resin onto the upper surface and the plurality of side surfaces of the light emitting element such that a first lowermost edge of the adhesive resin at a corner where adjacent ones of the side surfaces of the light emitting element meet is positioned lower than a second lowermost edge of the adhesive resin adjacent to a center of the upper edge of each of the side surfaces of the light emitting element;

disposing a light transmissive member over the upper surface of the light emitting element with the adhesive resin being interposed between the light transmissive member and the upper surface of the light emitting element, and pressing the adhesive resin with the light transmissive member; and curing the adhesive resin.

2. The method of manufacturing the light emitting device according to claim 1, wherein the applying of the adhesive resin includes applying the adhesive resin such that a height of a first portion of the adhesive resin located at a center of the upper surface of the light emitting element is higher than a height of a second portion of the adhesive resin located at a corner of the upper surface of the light emitting element, as measured from the upper surface of the light emitting element.

3. The method of manufacturing the light emitting device according to claim 2, wherein the applying of the adhesive resin includes applying the adhesive resin so as to include the first portion, the second portion, and a third portion between the first portion and the second portion, and the height of the second portion is higher than a height of the third portion as measured from the upper surface of the light emitting element.

4. The method of manufacturing the light emitting device according to claim 3, wherein the applying of the adhesive resin includes applying the adhesive resin so that the second portion is continuous with a portion of the adhesive resin located at the corner where the adjacent ones of the side surfaces of the light emitting element meet.

5. The method of manufacturing the light emitting device according to claim 1, wherein the light transmissive member has a lower surface and a plurality of side surfaces connected to the lower surface, an area of the lower surface being larger than an area of the upper surface of the light emitting element, and the pressing of the adhesive resin includes pressing the adhesive resin with the light transmissive member such that the adhesive resin reaches an outer edge of the lower surface of the light transmissive member.

6. The method of manufacturing the light emitting device according to claim 1, wherein the pressing of the adhesive resin includes pressing the adhesive resin with the light transmissive member such that the adhesive resin reaches lower ends of the side surfaces of the light emitting element.

7. The method of manufacturing the light emitting device according to claim 1, further comprising before the applying of the adhesive resin, disposing the light emitting element on a wiring substrate, wherein the pressing of the adhesive resin includes pressing the adhesive resin with the light transmissive member so that the adhesive resin after being pressed in the pressing of the adhesive resin is spaced apart from the wiring substrate.

8. The method of manufacturing the light emitting device according to claim 1, wherein the applying of the adhesive resin includes disposing a nozzle, which has an end surface larger than the upper surface of the light emitting element, above the light emitting element such that the end surface of the nozzle faces the upper surface of the light emitting element and an outer edge of the end surface of the nozzle is located outward relative to an outer edge of the upper surface of the light emitting element, and discharging the adhesive resin toward the upper surface of the light emitting element from the nozzle.

9. The method of manufacturing the light emitting device according to claim 8, wherein the nozzle has a discharge hole and a plurality of grooves in communication with the discharge hole, the discharge hole having an opening in a center of the end surface, and each of the grooves opens at the end surface and extending from the discharge hole to the outer edge of the end surface, and the discharging of the adhesive resin includes discharging the adhesive resin from the discharge hole such that the adhesive resin is applied onto the upper surface of the light emitting element, and flows from the discharge hole along each of the grooves so as to be applied to the corner where the adjacent ones of the side surfaces of the light emitting element meet.

10. The method of manufacturing the light emitting device according to claim 9, wherein each of the grooves has a constant width and a constant depth.

11. The method of manufacturing the light emitting device according to claim 1, further comprising after the curing of the adhesive resin, disposing a covering member to cover side surfaces of the adhesive resin and side surfaces of the light transmissive member.

12. The method of manufacturing the light emitting device according to claim 6, wherein the pressing of the adhesive resin includes pressing the adhesive resin with the light transmissive member such that the adhesive resin covering each of the side surfaces of the light emitting element has a curved surface protruding in a direction away from a corresponding one of the side surfaces of the light emitting element after the pressing of the adhesive resin.

13. The method of manufacturing the light emitting device according to claim 1, wherein the pressing of the adhesive resin includes pressing the adhesive resin with the light transmissive member such that the adhesive resin covering each of the side surfaces of the light emitting element maintains a convex surface protruding in a direction away from a corresponding one of the side surfaces of the light emitting element after the pressing of the adhesive resin.

* * * * *